United States Patent [19]
Aso et al.

[11] Patent Number: 5,381,514
[45] Date of Patent: Jan. 10, 1995

[54] SPEECH SYNTHESIZER AND METHOD FOR SYNTHESIZING SPEECH FOR SUPERPOSING AND ADDING A WAVEFORM ONTO A WAVEFORM OBTAINED BY DELAYING A PREVIOUSLY OBTAINED WAVEFORM

[75] Inventors: Takashi Aso, Yokohama; Yasunori Ohora, Tokyo, both of Japan

[73] Assignee: Canon Kabushiki Kaisha, Tokyo, Japan

[21] Appl. No.: 101,621

[22] Filed: Dec. 23, 1992

[30] Foreign Application Priority Data

Mar. 13, 1989 [JP] Japan .................. 1-60339

[51] Int. Cl.$^6$ .............................................. G10L 9/00
[52] U.S. Cl. ................... 395/2.73; 395/2.76
[58] Field of Search ................... 381/29–53; 395/2, 2.67–2.78

[56] References Cited

U.S. PATENT DOCUMENTS

| | | | |
|---|---|---|---|
| 4,278,838 | 7/1981 | Antonov | 381/52 |
| 4,327,419 | 4/1982 | Deutsch et al. | 364/717 |
| 4,589,138 | 5/1986 | Milner et al. | 381/51 |
| 4,815,135 | 3/1989 | Taguchi | 381/37 |
| 4,937,873 | 6/1990 | McAulay | 381/51 |

OTHER PUBLICATIONS

"The Use of Linear Protection of Speech In Computer Music Applications", *The Journal of the Audio Engineering Society*, J. A. Moorer, vol. 27, No. 3, Mar. 1979, pp. 134–140, New York.

Primary Examiner—Allen R. MacDonald
Assistant Examiner—Michelle Doerrler
Attorney, Agent, or Firm—Fitzpatrick, Cella, Harper & Scinto

[57] ABSTRACT

A speech synthesizer includes a first indicator for indicating the amplitude of a waveform by using a random number, a second indicator for indicating the superposition period for waveforms by using a random number, a waveform generator for generating first and second waveforms having an amplitude indicated by the first indicator, and a waveform superposition device for synthesizing an unvoiced speech waveform by superposing the second waveform generated by the waveform generator onto a waveform obtained by delaying the first waveform by a superposition period indicated by the second indication means. The speech synthesizer is capable of making the frequency characteristic of unvoiced speech analogous to that of white noise, and generating synthesized speech which is natural and analogous to an actual human voice.

12 Claims, 5 Drawing Sheets

SPEECH SYNTHESIZER AND METHOD FOR SYNTHESIZING SPEECH FOR SUPERPOSING AND ADDING A WAVEFORM ONTO A WAVEFORM OBTAINED BY DELAYING A PREVIOUSLY OBTAINED WAVEFORM

BACKGROUND OF THE INVENTION

1. Field of the Invention

The present invention relates to a speech synthesizer for synthesizing a speech waveform by superposing impulse response waveforms.

2. Related Background Art

Various types of synthesizing methods for use with a speech synthesizer have been proposed heretofore. As compared with a speech synthesizer using a recording/editing method (PCM, ADPCM or the like), a speech synthesizer using a parameter editing method which uses speech feature parameters derived previously from a speech or a rule synthesizing method are very effective in information compression so that various types of words and sentences are allowed to be synthesized, although it produces an unnatural synthesized speech that is hard to understand.

According to the parameter editing method, various types of feature parameters called PARCOR, LSP, or cepstrum are used as the coefficients of a synthesizer filter which superposes impulse response waveforms to produce a synthesized speech. Generally, an impulse train signal is inputted to the synthesizer filter for synthesizing voiced speech, whereas a white noise signal or M-series signal is inputted for synthesizing unvoiced speech. A synthesizer filter having a minimum phase characteristic is often used.

Female speech, fairly natural and beautiful, can be synthesized although it has been heretofore considered difficult to synthesize as such, by using a method of superposing zero phase impulse response waveforms in the power spectrum envelope (PSE) speech analysis/synthesis method which aims at a high quality speech synthesis on the basis of the same parameter editing method.

This method of superposing zero phase impulse response waveforms is called an "OWA (Over-Wrap-Adding) method. This OWA method will be briefly described.

Voiced speech mainly constituting a vowel sound is a sound which is produced such that air expired from a lung pulses intermittently at a constant period by using vibration of the vocal chords, and resonation at the tongue, lips, chin and so on. The period of intermittent vibration of the vocal chords determine the pitch of the sound. A change in the vibration period of the vocal chords with time causes one's accent and intonation. Alternatively, unvoiced speech constituting a particular consonant is a sound which is produced such that air expired from a lung has a turbulent flow having an indefinite period when it passes through a narrow space (called an articulatory point) defined particularly by the tongue tip, teeth, lips and so on within the articulatory organs.

A speech synthesizer generally synthesizes a speech waveform by using synthesizing processes analogous to those for human speech as described above.

FIG. 6 shows an example of the typical structure of a conventional speech synthesizer.

In FIG. 6, a speech signal, generated by an oscillator 1 corresponding to human vocal chords and an articulatory point, is shaped and modulated by a modulation circuit 2 corresponding to human articulatory organs, and converted into a speech at a speaker 3 and outputted therefrom.

The oscillator 1 is constructed of a noise generator 1-1 for generating high frequency white noises, a pulse generator 1-2 for generating pulses of a predetermined period which are used for voiced speech, a switch 1-3, and a variable amplifier (multiplier) 1-4. In response to an instruction supplied for each speech section from an external master device (system controller), the switch 1-3 selects either the noise generator 1-1 or the pulse generator 1-2.

In producing voiced speech, a voiced speech indication V causes the switch 1-3 to select the pulse generator 1-2 which generates pulse signals of a predetermined period P determined by an external instruction. The pulse signals are sent via the switch 1-3 to the variable amplifier 1-4 at which they are amplified at gains defined by partial autocorrelation coefficients. Thereafter, they are sent to the modulation circuit 2 using a vocal tract articulatory equivalent filter at which they are shaped and modulated into a voiced synthesized speech waveform and outputted from the speaker 3.

In a similar manner, in producing unvoiced speech, an unvoiced speech indication U causes the switch 1-3 to select the noise generator 1-3 which generates noise signals. The noise signals are sent via the switch 1-3 to the variable amplifier 1-4 at which they are amplified. The amplified noise signals are shaped and modulated into an unvoiced synthesized waveform and outputted from the speaker 3.

Various control data such as the frequency P, the amplitude A, and so on, of a signal supplied to the speech synthesizer circuit have been determined heretofore such that a speech waveform of an actual human voice is analyzed by means of one of the above-described various speech analysis methods, and the speech wave form is attributed to a certain model determined by the analysis results.

With the above-described OWA method, synthesized speech has been produced such that for a voiced speech section having a pitch, a power spectrum envelope (PSE) obtained in accordance with a power spectrum envelope parameter is subjected to an inverse Fourier transform to thereby generate an impulse response waveform, and the impulse response waveform is superposed at the modulation circuit 2 at a time interval of the pitch period. Also, for an unvoiced speech section without a pitch, an impulse response waveform is obtained in accordance with the power spectrum envelope at the section, the impulse response waveforms to the noise signal are multiplied by random values having a zero mean value at an equal time interval (about 0.17 msec time interval), to thereby randomly change the amplitudes of the impulse response waveforms which are then superposed, and the obtained unvoiced synthesized waveform is multiplied by a coefficient at an interval of a constant section to thereby make the power of the synthesized waveform substantially equal to the original speech waveform and realize a characteristic similar to random noise.

With the conventional OWA method, particularly in synthesizing a speech at the unvoiced speech section, the amplitudes of noise signals are changed randomly. However, the period for superposing the impulse response waveforms is constant so that the synthesized speech sounds something like a sound from a buzzer for example. Further, there arises also a disadvantage that unvoiced speech synthesized by the conventional OWA method does not have a random noise characteristic analogous to the human voice in the strict sense of the word. This is confirmed by a finer frequency resolution spectrum analysis of the synthesized waveform, which analysis indicates the presence of spectrum peaks at the positions of the integral-fold of the superposition frequency (an inverse of the superposition period).

SUMMARY OF THE INVENTION

It is an object of the present invention to eliminate the above-described prior art disadvantages and provide a speech synthesizer capable of generating a synthesized speech natural and analogous to an actual human voice by randomly changing the amplitudes of impulse response waveforms in synthesizing unvoiced speech, and in addition, randomly changing the superposition period for the impulse response waveforms to make the frequency characteristic at the unvoiced speech section analogous to that of white noises.

DETAILED DESCRIPTION OF THE PREFERRED EMBODIMENTS

Preferred embodiments of this invention will be described in detail with reference to the accompanying drawings.

Figure 1:
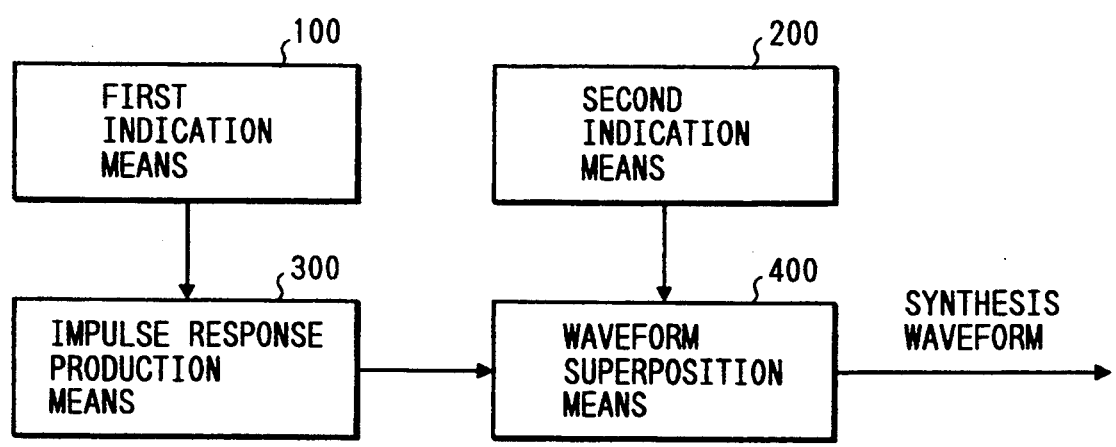
FIG. 1 is a block diagram showing the fundamental structure of an embodiment of this invention.

FIG. 1 shows the fundamental structure of an embodiment of this invention.

In FIG. 1, reference numeral 100 represents first indication means for indicating the amplitude of an impulse response waveform by using a random number.

Reference numeral 200 represents second indication means for indicating the superposition period for impulse response waveforms by using a random number.

Reference numeral 300 represents impulse response waveform generating means for generating an impulse response waveform having an amplitude indicated by the first indication means.

Reference numeral 400 represents waveform superposition means for synthesizing an unvoiced speech waveform by superposing an impulse response waveform generated by the impulse response waveform generating means onto an impulse response waveform obtained by delaying the first-mentioned impulse response waveform by a superposition period indicated by the second indication means.

Figure 2:
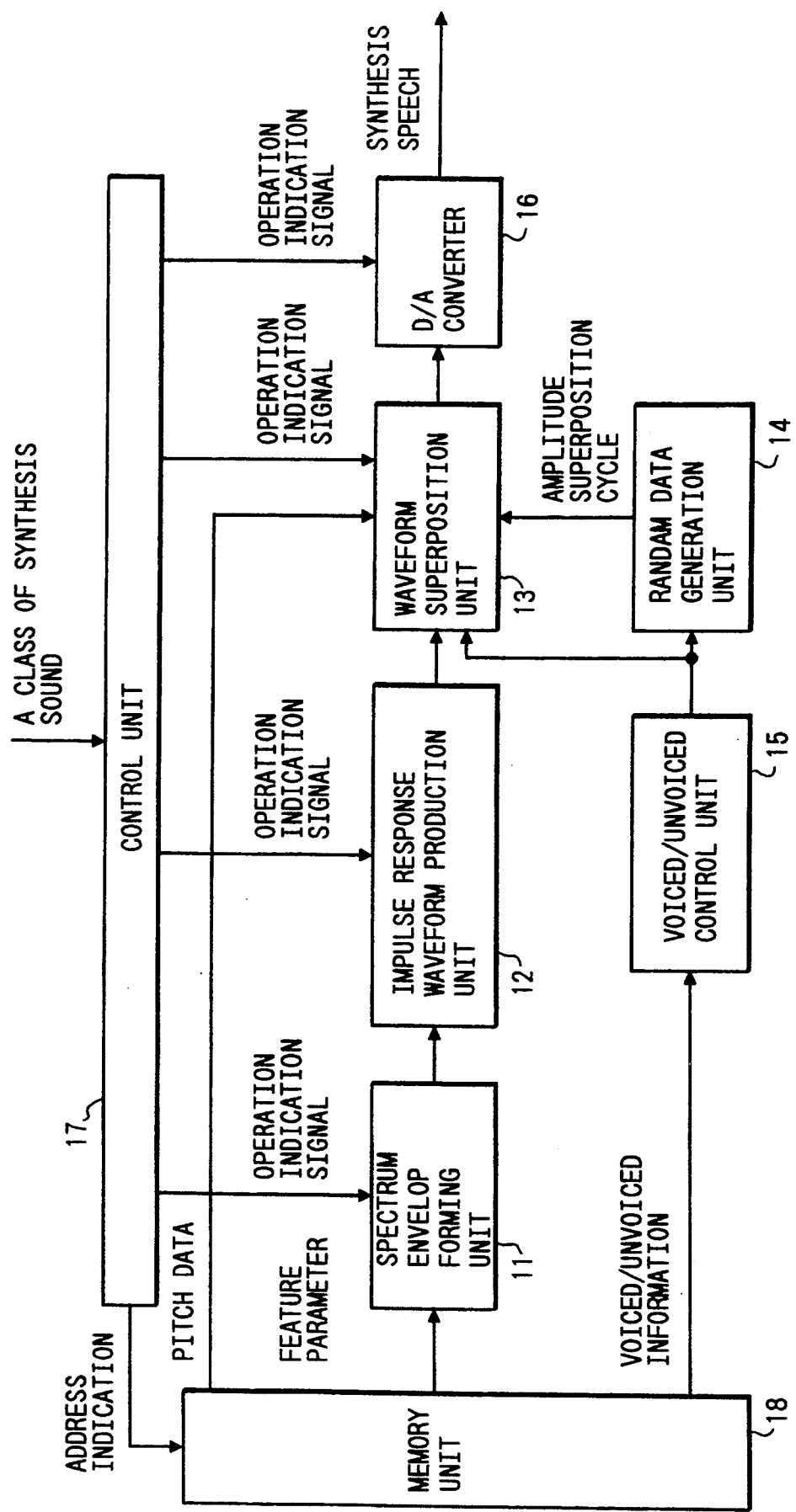
FIG. 2 is a block diagram showing a particular circuit arrangement according to an embodiment of this invention.

FIG. 2 shows a circuit arrangement of the first embodiment of this invention. In FIG. 2, reference numeral 11 represents a spectrum envelope forming unit constructed of a filter circuit and an arithmetic operation circuit, the spectrum envelope forming unit forming spectrum envelope information at each point of time starting from the synthesizing commencement in accordance with a time-sequential vector of a feature parameter. Reference numeral 12 represents an impulse response waveform production unit, which may be an impulse signal generator such as a differential circuit, the unit producing an impulse response waveform in accordance with the spectrum envelope information obtained by the spectrum envelope forming unit 11.

Reference numeral 13 represents a waveform superposition unit often constructed of a filter circuit, which unit delays an impulse response waveform obtained from the impulse response waveform production unit 12 by a predetermined time, and superposes the delayed impulse response waveform onto the first-mentioned impulse response waveform to thereby produce a synthesized speech waveform. Reference numeral 14 represents a random data generation unit constructed of a random generator, which unit generates random values used in superposing unvoiced speech impulse response waveforms. The random values determine the amplitude and superposition period of unvoiced speech waveforms.

Reference numeral 15 represents a voiced/unvoiced control unit which indicates a proper impulse response waveform superposition method at each voiced or unvoiced speech section in accordance with voiced/unvoiced information indicative of the type of synthesized speech stored in a memory unit 18. Reference numeral 16 represents a D/A converter for D/A converting speech waveform data outputted from the waveform superposition unit 13 and outputting a synthesized speech. Reference numeral 17 represents a control unit constructed of a timing signal generator which unit controls the entirety of the synthesizer.

The memory unit 18 stores therein the pitch data, feature parameter data, voiced/unvoiced information and the, length of speech for each speech to be synthesized. The stored information at an address indicated by the control unit 17 is outputted from the memory unit 18.

Figure 3:
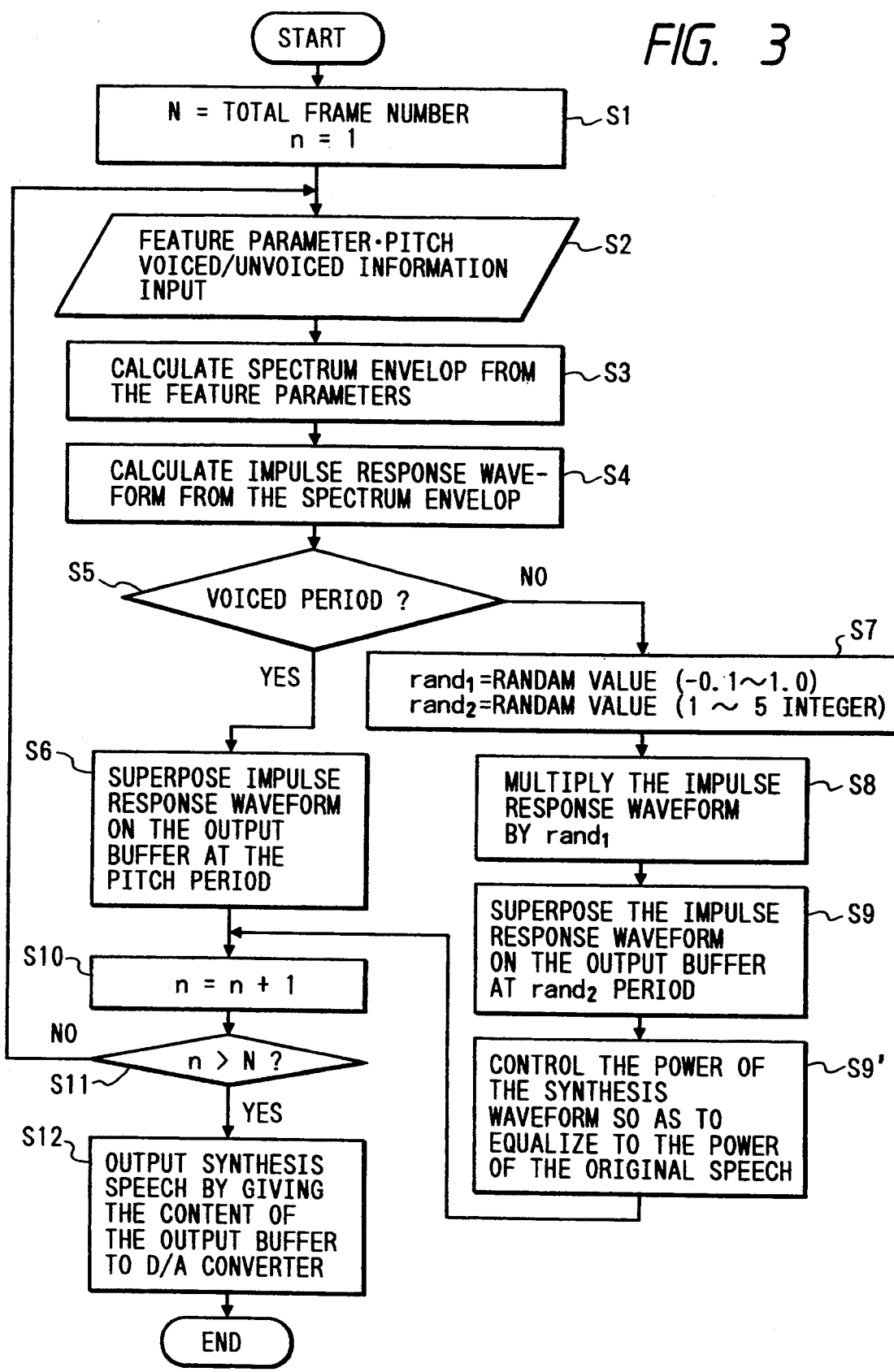
FIG. 3 is a flow chart illustrating the operation procedure according to the embodiment of this invention.

FIG. 3 is a flow chart illustrating the operation procedure according to the embodiment of this invention. The operation of the circuit shown in FIG. 2 will be described with reference to the flow chart shown in FIG. 3.

Upon reception from an external device of a type of a speech to be synthesized, the control unit 17 reads from the memory unit 18 the length N (frame number) of the speech to be synthesized, and after setting a counter n included in the control unit 17 at 1, counting of the number of frames starts (step S1).

Next, the pitch data, the feature parameter and voiced/unvoiced information for one frame are supplied from the memory unit 18 (step S2).

The feature parameter indicates spectrum envelope information and may use a linear prediction coefficient, cepstrum coefficient, PSE coefficient or the like in dependence on the type of a selected speech synthesizing method.

An inputted feature parameter is converted into spectrum envelope information by the spectrum envelope forming unit 11 (step S3). Next, the impulse response waveform production unit 12 causes the spectrum envelope information obtained at step S3 to undergo a complex number inverse Fourier transform operation (inverse FFT), to thereby form an impulse response waveform (step S4).

Figure 4:
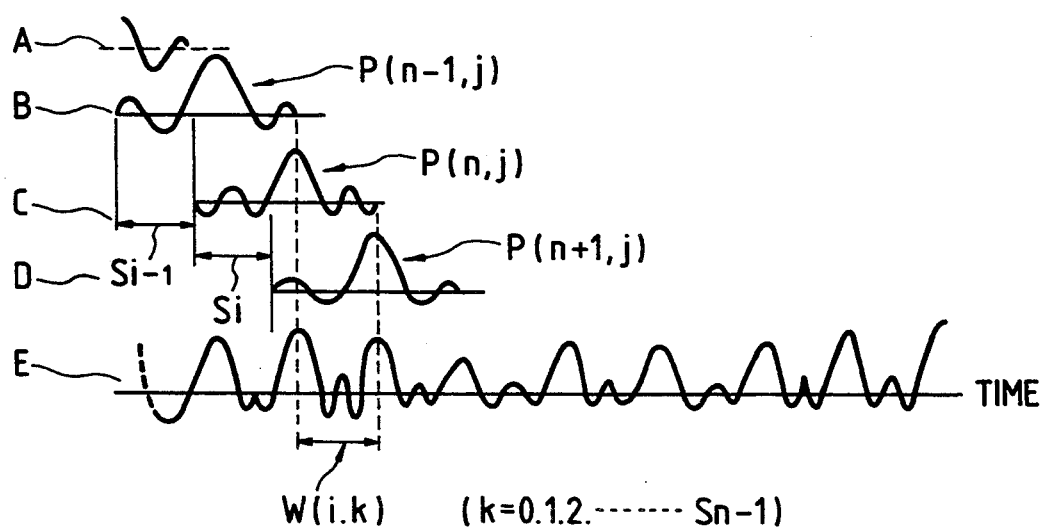
FIG. 4 shows impulse response waveforms according to the embodiment of this invention.

In this case, in order to form a zero phase impulse response waveform, spectrum envelope data, symmetrical to the central frequency 0, is entered in the real part of an input data for the complex number inverse Fourier transform, whereas in the imaginary part, 0 is entered. Assuming that an impulse response waveform is obtained through an inverse Fourier transform at 512 points, there is obtained as the output real part an impulse response waveform P(n, j), (j = −256, . . . , −1, 0, 1, . . . , 256) symmetrical with the center (257-th) of 512 points as shown at D in FIG. 4. n represents the value indicated by the internal counter of the control unit 18.

Next, the waveform superposition unit 13 discriminates in accordance with an indication signal from the voiced/unvoiced control unit 15 whether the speech to be synthesized is voiced speech or unvoiced speech, and selects a proper waveform superposing method (step S5). If the synthesizing section corresponds to voiced section, by using a pitch data, the superposition result obtained previously and stored in an output buffer included in the waveform superposition unit 13 is superposed onto the impulse response waveform P (n, j) (step S6). If the synthesizing section corresponds to a voiced section, the random data generation unit 14 is actuated in response to a control signal from the voiced/unvoiced control unit 15, and generates an amplitude random number $rand_1$ and a period random number $rand_2$ (step S7).

Next, in the waveform superposition unit 13, the impulse response waveform is multiplied by the amplitude random number $rand_1$ to randomly change the amplitude (step S8). Thereafter, the obtained impulse response waveform P (n, j) is superposed onto waveforms Si, Si-1, . . . , So sequentially delayed by the period of the random number $rand_2$ (step S9). In addition, in order to make the power of the superposed and synthesized waveform equal to that of the original waveform, the former waveform is multiplied by a coefficient (step S9').

The speech synthesizing process for the n-th frame (in this case, the first frame) is thus completed.

Thereafter, the count n of the counter is incremented by 1 (step S10). The above speech waveform synthesizing calculation process is repeated until the count n reaches the total frame number N (steps S11 to S2).

After completion of the synthesizing calculation process for all the frames, the synthesized result stored in the output buffer is sent to the D/A converter 6 to output a synthesized speech.

In the first embodiment of this invention, the speech synthesizer is constructed of hardware (digital signal circuits). The speech synthesizer may be constructed of software (microprograms).

Figure 5:
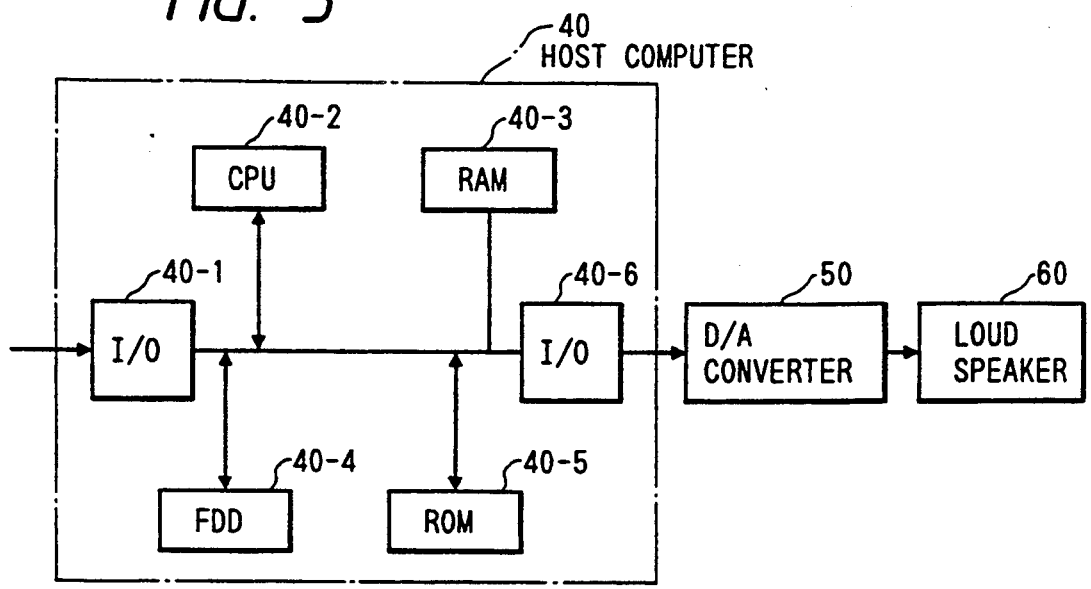
FIG. 5 is a block diagram showing a circuit arrangement according to a second embodiment of the invention.
Figure 6:
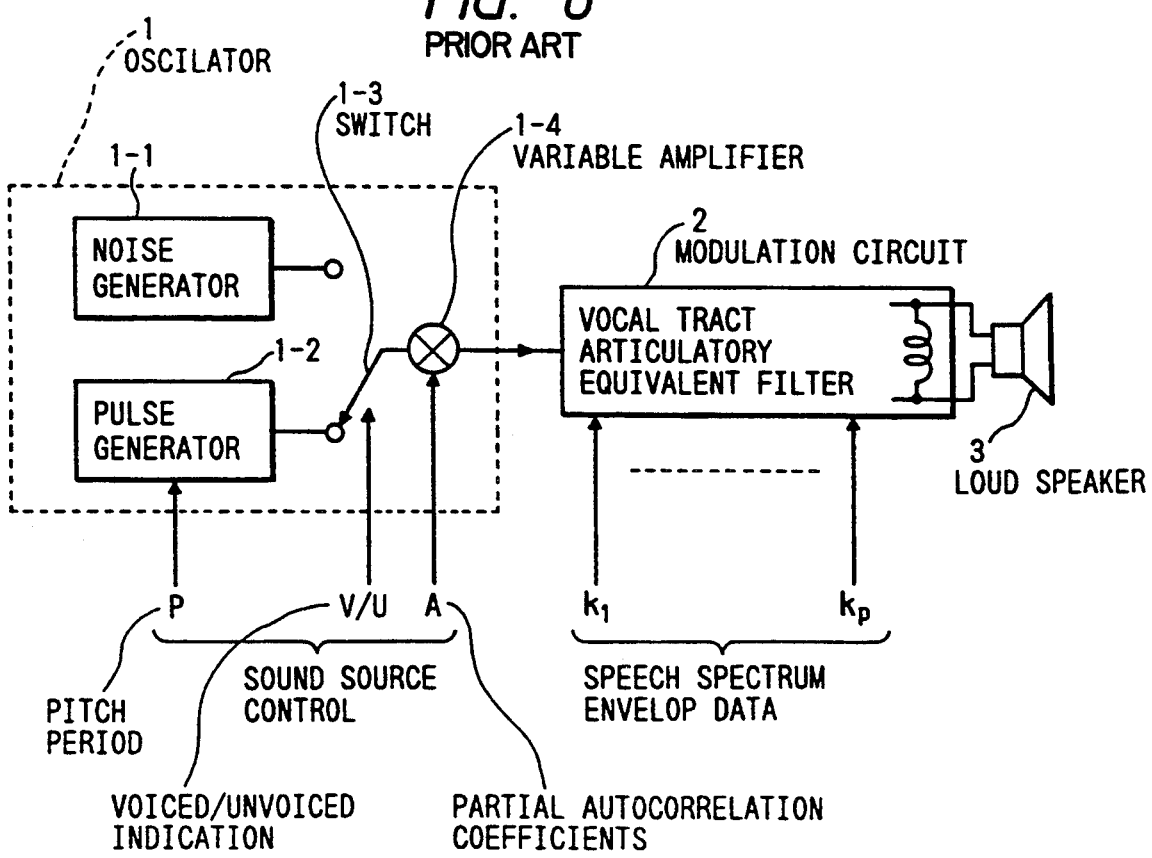
FIG. 6 is a block diagram showing a conventional circuit arrangement.

Another embodiment which is constructed of software is shown in FIG. 5.

In FIG. 5, a host computer 40 is constructed of an interface (I/O) 40-1, a central processing unit (CPU) 40-2, a random access memory (RAM) 40-3, a floppy disc storage unit (FDD) 40-4, and a read-only memory (ROM) 40-5. FDD 40-4 stores previously stored pitch data, the feature parameter, and voiced/unvoiced information for each speech to be synthesized.

ROM 40-5 stores a previously stored control program, expressed by a programming language, of the control procedure shown in FIG. 3. CPU 40-2 executes the control program to generate an impulse response waveform for voiced or unvoiced speech. RAM 40-3 is used for storing various numerical values obtained during calculation of an impulse response waveform.

A digital impulse response waveform signal formed under control of CPU 40-2 is converted into an analog signal at a D/A converter 50 and a synthesized speech is outputted from a speaker 60.

The present invention is not limited to the above embodiments, but various modifications are possible. For example, in the above embodiment, the pitch data and voiced/unvoiced information are independently supplied. Instead, since the voiced/unvoiced information is information for discriminating between the voiced and unvoiced sections of a frame concerned, it may be included within the pitch data. For instance, the negative value of the pitch data may indicate voiced speech, and the positive value unvoiced speech.

Further, in the above embodiment, the impulse response waveform superposition period random number $rand_2$ takes an integer from 1 to 5. This random number may be changed as desired.

Figure 7:
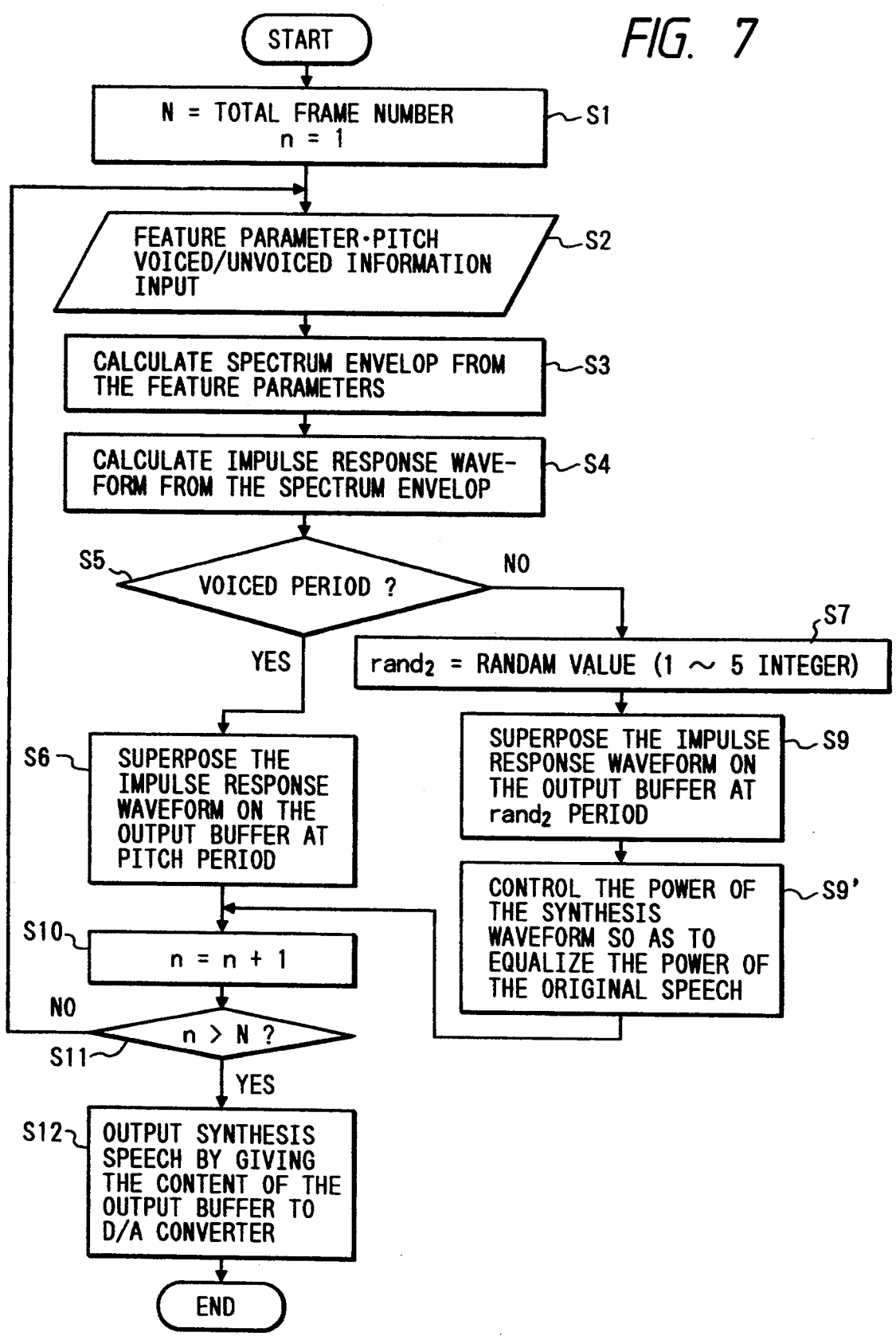
FIG. 7 is a flow chart showing the operation procedure according to another embodiment of this invention.

In the above embodiment, the amplitude is randomly changed by using the random number $rand_1$. Instead, the amplitude may be maintained fixed and only the superposition period may be randomly changed with a similar advantages to this invention. The flow chart illustrating the case where the amplitude is maintained fixed is shown in FIG. 7. Different from the flow chart shown in FIG. 3, there are not presented the step of obtaining $rand_1$ for changing the amplitude and the step of multiplying an impulse response waveform by $rand_2$. In the same manner as FIG. 3, at step S9' in FIG. 7 a synthesized waveform is multiplied by a coefficient so as to make the power of the synthesized waveform equal to that of the original speech.

As described so far, a speech synthesizer can be obtained which has the advantage that it can generate a synthesized speech natural and analogous to human actual voice by randomly changing the amplitudes of impulse response waveforms in synthesizing unvoiced speech, and in addition randomly changing the superposition period for the impulse response waveforms to make the frequency characteristic at the unvoiced speech section analogous to that of white noises.

What is claimed is:

1. A speech synthesizer comprising:
   first indication means for indicating the amplitude of a waveform by using a random number;
   second indication means for indicating the superposition period for waveforms by using a random number;
   waveform generating means for generating a waveform having an amplitude indicated by said first indication means;
   waveform superposition means for superposing and adding the waveform generated by said waveform generating means onto a waveform obtained by delaying the waveform, which is previously generated by said waveform generating means, by a superposition period indicated by said second indication means; and
   output means for outputting the waveform added by said waveform superposition means as unvoiced speech.

2. A speech synthesizer according to claim 1, further comprising means for multiplying an unvoiced speech waveform synthesized by said waveform superposition means by a coefficient in order to control the power of the unvoiced speech waveform synthesized by said waveform superposition means.

3. A speech synthesizer according to claim 1, further including:
identification means for identifying whether speech to be synthesized is voiced speech or unvoiced speech; and
control means for controlling the superposition of the waveforms in accordance with the result of identification by said identification means.

4. A speech synthesizer comprising:
indication means for indicating the superposition period of waveforms by using a random number;
waveform superposition means for synthesizing an unvoiced speech waveform by superposing and adding a second waveform onto a waveform obtained by delaying a first waveform by said superposition period indicated by said indication means; and
output means for outputting the waveform added by said waveform superposition means as unvoiced speech.

5. A speech synthesizer according to claim 4, further comprising means for multiplying an unvoiced speech waveform synthesized by said waveform superposition means by a coefficient in order to control the power of the speech waveform synthesized by said waveform superposition means.

6. A speech synthesizer according to claim 4, further including:
identification means for identifying whether speech to be synthesized is voiced speech or unvoiced speech; and
control means for controlling the superposition of the waveform in accordance with the result of identification by said identification means.

7. A method for synthesizing speech, comprising the steps of:
indicating the amplitude of a waveform by using a random number;
indicating the superposition period for waveforms by using a random number;
generating a waveform having an amplitude indicated by said amplitude indicating step;
superposing and adding the waveform generated in said generating step onto a waveform obtained by delaying the waveform, which is previously generated in said waveform generating step, by a superposition period indicated in said indicating step; and
outputting the waveform added in said superposing and adding step as unvoiced speech.

8. A method for synthesizing speech according to claim 7, further comprising the step of controlling the power of a speech waveform synthesized in said superposing step by multiplying the speech waveform by a coefficient.

9. A method for synthesizing speech according to claim 7, further including the steps of:
identifying whether speech to be synthesized is voiced speech or unvoiced speech, and
controlling the superposition of the waveforms in accordance with the result of identification in said identifying step.

10. A method for synthesizing speech, comprising the steps of:
indicating the superposing period of a waveform by using a random number;
synthesizing an unvoiced speech waveform by superposing and adding a second waveform onto a waveform obtained by delaying a first waveform by the superposition period indicated in said indicating step; and
outputting the waveform added in said superposing and adding step as unvoiced speech.

11. A method for synthesizing speech according to claim 10, further comprising the step of controlling the power of a speech waveform synthesized in said synthesizing step by multiplying the speech waveform by a coefficient.

12. A method for synthesizing speech according to claim 10, further including the steps of:
identifying whether speech to be synthesized is voiced speech or unvoiced speech, and
controlling the superposition of the waveforms in accordance with the result of identification in said identifying step.

* * * * *

UNITED STATES PATENT AND TRADEMARK OFFICE
CERTIFICATE OF CORRECTION

PATENT NO. : 5,381,514  Page 1 of 3
DATED : January 10, 1995
INVENTOR(S) : TAKASHI ASO, et al.

It is certified that error appears in the above-indentified patent and that said Letters Patent is hereby corrected as shown below:

ON THE COVER PAGE

Between [22] and [30]

Insert --[63] Related U.S. Application Data
Continuation of Ser. No. 492,071, March 12, 1990, abandoned.--.

IN THE DRAWINGS

Sheet 2 of the Drawings

FIG. 2

In Box 11, "ENVELOP" should read --ENVELOPE--.
In Box 14, "RANDAM" should read --RANDOM--.

Sheet 3 of the Drawings

FIG. 3

In Steps S3 and S4, "ENVELOP" (both occurrences) should read --ENVELOPE--.
In Step S7, "RANDAM" (both occurrences) should read --RANDOM--.

Sheet 4 of the Drawings

FIG. 6

"ENVELOP" should read --ENVELOPE--.

UNITED STATES PATENT AND TRADEMARK OFFICE
CERTIFICATE OF CORRECTION

PATENT NO. : 5,381,514  Page 2 of 3

DATED : January 10, 1995

INVENTOR(S) : TAKASHI ASO, et al.

It is certified that error appears in the above-indentified patent and that said Letters Patent is hereby corrected as shown below:

Sheet 5 of the Drawings

FIG. 7

In Steps S3 and S4, "ENVELOP" (both occurrences) should read --ENVELOPE--.
        In Step S7, "RANDAM" should read --RANDOM--.

COLUMN 1

Between Lines 5 and 6, insert --This application is a continuation of application Serial No. 07/492,071 filed March 12, 1990, now abandoned.--.
    Line 20, "are" should read --is--.
    Line 52, "determine" should read --determines--.

COLUMN 4

Line 42, "information" should read --information,--.
    Line 43, "and the," should read --and the--.

UNITED STATES PATENT AND TRADEMARK OFFICE
CERTIFICATE OF CORRECTION

PATENT NO. : 5,381,514  Page 3 of 3
DATED : January 10, 1995
INVENTOR(S) : TAKASHI ASO, et al.

It is certified that error appears in the above-indentified patent and that said Letters Patent is hereby corrected as shown below:

COLUMN 6

Line 30, "advantages" should read --advantage--.
Line 45, "addition" should read --addition,--.

Signed and Sealed this

Thirteenth Day of June, 1995

Attest:

BRUCE LEHMAN

Attesting Officer   Commissioner of Patents and Trademarks